(12) United States Patent
Shimizu et al.

(10) Patent No.: US 7,946,008 B2
(45) Date of Patent: May 24, 2011

(54) METHOD OF MANUFACTURING A PIEZOELECTRIC VIBRATOR

(75) Inventors: Satoshi Shimizu, Tochigi (JP); Masaru Matsuyama, Tochigi (JP)

(73) Assignee: Seiko Instruments Inc. (JP)

( * ) Notice: Subject to any disclaimer, the term of this patent is extended or adjusted under 35 U.S.C. 154(b) by 907 days.

(21) Appl. No.: 11/796,443

(22) Filed: Apr. 27, 2007

(65) Prior Publication Data

US 2007/0209177 A1    Sep. 13, 2007

Related U.S. Application Data

(62) Division of application No. 11/093,617, filed on Mar. 30, 2005, now Pat. No. 7,269,885.

(30) Foreign Application Priority Data

Oct. 31, 2001 (JP) .................. 2001-335368

(51) Int. Cl.
*H01L 41/053* (2006.01)
*H02N 2/04* (2006.01)

(52) U.S. Cl. ......... 29/25.35; 29/594; 310/330; 310/344; 438/471; 219/121.65

(58) Field of Classification Search .............. 29/25.35, 29/594; 310/312, 330, 332, 344; 438/471; 219/121.6, 121.65, 121.85; 73/861.352
See application file for complete search history.

(56) References Cited

U.S. PATENT DOCUMENTS

| | | | | |
|---|---|---|---|---|
| 3,969,640 A | * | 7/1976 | Staudte | 310/312 |
| 4,021,898 A | * | 5/1977 | Willis et al. | 29/25.35 |
| 4,755,706 A | * | 7/1988 | Harnden et al. | 310/332 |
| 6,027,986 A | * | 2/2000 | Conte et al. | 438/471 |
| 6,477,901 B1 | * | 11/2002 | Tadigadapa et al. | 73/861.352 |
| 7,523,537 B1 | * | 4/2009 | Knowles et al. | 29/594 |

FOREIGN PATENT DOCUMENTS

JP    2006086585 A  *  3/2006

* cited by examiner

*Primary Examiner* — A. Dexter Tugbang
(74) *Attorney, Agent, or Firm* — Adams & Wilks

(57) ABSTRACT

A method of manufacturing a piezoelectric vibrator comprises forming a gettering metal film on a surface of a piezoelectric vibrator piece and forming a frequency-adjusting weight, separate from the gettering metal film, on the piezoelectric vibrator piece. The piezoelectric vibrator piece is then placed in a hermetic container after which the hermetic container is hermetically sealed. A laser beam is irradiated on the metal film to heat the same to getter gas contained inside the hermetic container, and after completion of gettering, the laser beam is irradiated on the frequency-adjusting weight to adjust the frequency of vibration of the piezoelectric vibrator piece.

14 Claims, 3 Drawing Sheets

METHOD OF MANUFACTURING A PIEZOELECTRIC VIBRATOR

CROSS REFERENCE TO RELATED APPLICATIONS

The present application is a division of U.S. application Ser. No. 11/093,617 filed Mar. 30, 2005, now U.S. Pat. No. 7,269,885, which is a division of U.S. application Ser. No. 10/281,006 filed Oct. 25, 2002, now U.S. Pat. No. 6,924,582, and claiming a priority date of Oct. 31, 2001.

BACKGROUND OF THE INVENTION

1. Field of the Invention

The present invention relates to a piezoelectric vibrator which is utilized for mobile information technology devices.

2. Background Information

In order to increase a degree of vacuum of a container which contains the piezoelectric vibrator, a method in which baking is done in vacuum before hermetic-sealing and a substance of a factor decreasing the degree of vacuum such as moisture adhering on surfaces of materials is removed has been conventionally used. In order to remove gas trapped inside the container, a method in which a small hole opened beforehand in the container is closed in vacuum by a technique generating little gas has been used.

In the method in which degassing is done by the baking before sealing, the gas generated during a sealing process is trapped in the container. Accordingly, oxygen, which is generated in case that the sealing is done by anode bonding, is trapped in the container to decrease the degree of vacuum. This results in an increase in equivalent series resistance R1. In case that the equivalent series resistance R1 is increased, such a problem is generated that battery life is decreased, when the piezoelectric vibrator is used for mobile devices. In the method in which the small hole opened beforehand in the container is closed in vacuum, another process different from the sealing process, in which the small hole is closed, is required, so that man-hour is increased.

SUMMARY OF THE INVENTION

In order to solve the above-described problems, in a piezoelectric vibrator of the invention, a gettering substance for gettering inner gas is provided in a sealed space formed by a hermetic container in which the piezoelectric vibrator piece is arranged. The gettering substance is formed on a surface of the piezoelectric vibrator piece or an inside wall of the hermetic container. A metal film made of at least a kind of metal or its alloy selected from a group of aluminum, titanium, and zirconium is used as the gettering substance.

A manufacturing method for the piezoelectric vibrator of the invention includes a process in which an electrode for oscillation and the metal film for gettering gas are formed simultaneously on the piezoelectric vibrator piece, a process in which the piezoelectric vibrator piece is held in the hermetic container and the hermetic container is hermetic-sealed, and a process in which the metal film is heated by a laser beam from outside to perform gettering of the inner gas of the hermetic-sealed container. Another manufacturing method for the piezoelectric vibrator of the invention includes a process in which the metal film for gettering is provided inside the hermetic container which contains the piezoelectric vibrator piece, a process in which the hermetic container is hermetic-sealed so that the piezoelectric vibrator piece is sealed inside the container, and a process in which the laser beam is irradiated from outside onto the metal film to perform gettering of the inner gas of the hermetic-sealed container.

As described above, as the method for gettering gas in the container after sealing, the gettering substance is provided in the container and then the gettering substance is irradiated from a transparent portion of the container by a YAG laser.

DETAILED DESCRIPTION OF THE PREFERRED EMBODIMENTS

Figure 1:
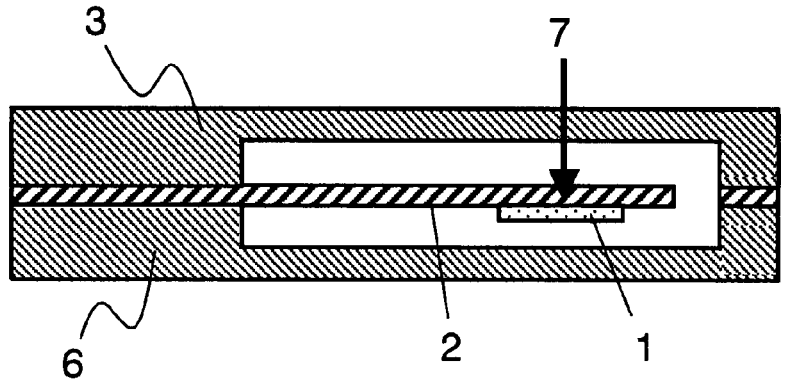
FIG. 1 is a sectional view showing a first embodiment of the invention.

In a piezoelectric vibrator of the invention, a gettering substance for gettering inner gas is provided on an inside wall of a hermetic container having the piezoelectric vibrator piece inside or a surface of the piezoelectric vibrator piece which is arranged in the hermetic container. A metal film made of at least a kind of metal or its alloy selected from a group of aluminum, titanium, and zirconium is suitable for the gettering substance. An electrode for oscillation is also formed on the piezoelectric vibrator piece. The electrode for oscillation may be also formed by the same material as the metal film for gettering. By using the above-described structure, gettering the gas in the hermetic container is performed, so that a decrease in a degree of vacuum can be prevented.

Another piezoelectric vibrator of the invention includes a piezoelectric vibrator plate in which a piezoelectric vibrator piece and a frame portion surrounding a periphery of the piezoelectric vibrator piece are integrally formed at a base portion of the piezoelectric vibrator piece, a cover which is bonded to the piezoelectric vibrator plate by the anode bonding through the metal film which is provided on a top surfaces of the frame portion, the container which is bonded to the piezoelectric vibrator plate by the anode bonding through the metal film which is provided on a bottom surfaces of the frame portion, and the gettering substance which is provided on a surface of the piezoelectric vibrator piece. The electrode for oscillation is also formed on the surface of the piezoelectric vibrator piece. It is desirable to use the metal film as the gettering substance. In case that a weight for adjusting frequency is provided on the piezoelectric vibrator piece, the weight is provided at an end portion side of the piezoelectric vibrator piece so as to separate from the metal film for gettering arranged on the surface of the piezoelectric vibrator piece. By using the above-described structure, gettering the gas in the hermetic container is performed, so that a decrease in a degree of vacuum can be prevented.

A manufacturing method for the piezoelectric vibrator of the invention includes a process in which the electrode for oscillation and the metal film for gettering gas are formed on the piezoelectric vibrator piece, a process in which the piezoelectric vibrator piece is held in the hermetic container having a transparent portion and the hermetic container is hermetic-sealed, and a process in which the metal film is heated by the laser beam from outside through the transparent portion of the container to perform gettering of the inner gas of the hermetic-sealed container. According to the method, the metal is heated by the laser irradiation to be vaporized. The vaporized metal is combined with the oxygen in the container to be a metal oxide, which results in a decrease in the oxygen in the container and an increase in the degree of vacuum of the container. For example, in case that the electrode made of aluminum is irradiated by the laser beam, the vaporized aluminum is combined with the oxygen to be aluminum oxide, which causes the degree of vacuum of the container to be increased. Al, Ti, Zr or an alloy of these metals may be used as the metal.

There may be a method in which the metal film for gettering is formed inside the hermetic container of the piezoelectric vibrator, and then after hermetic-sealing, the metal is heated by the laser beam from outside through the transparent portion of the container to perform gettering of the inner gas of the hermetic-sealed container.

FIRST EMBODIMENT

A first embodiment of the invention will be described on a basis of figures.

Figure 2:
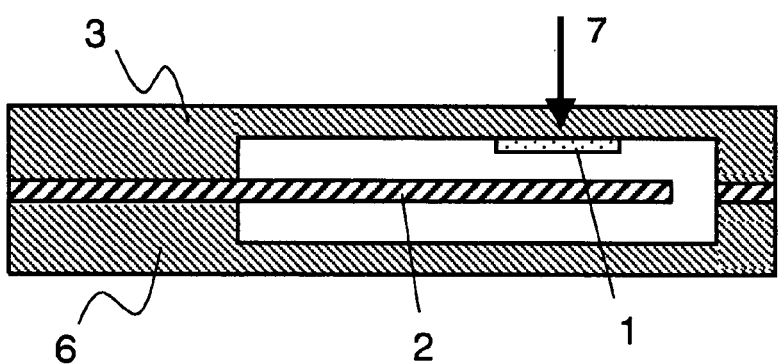
FIG. 2 is a sectional view showing a modification of the first embodiment of the invention.

A piezoelectric vibrator of the first embodiment will be described referring to FIGS. 1 and 2. As shown in FIGS. 1 and 2, the piezoelectric vibrator of the embodiment includes a piezoelectric vibrator plate in which a quartz resonator piece (a vibrator piece) 2 and a frame portion surrounding a periphery of the quartz resonator piece are integrally formed at a base portion of the quartz resonator piece, a glass cover 3, and a glass cover or container 6. With using the anode bonding technique, the upper frame portion of the piezoelectric vibrator plate is bonded to the glass cover 3 and the glass container 6 by a metal film (not shown) which is provided on a top and a bottom surfaces of the frame portion. This allows the quartz resonator piece 2 to have a structure disposed in a hermetically sealed cavity 10 defined by the glass cover 3 and the glass container 6.

FIG. 1 is a schematically sectional view of a piezoelectric vibrator in which a metal film 1 as the gettering substance is arranged on a bottom surface of the quartz resonator piece 2. A laser beam 7 is irradiated from a top surface of the glass cover 3, the laser beam 7 transmits through the glass cover 3 and the quartz resonator piece 2 to heat the metal film 1, the vaporized metal absorbs oxygen in the sealed space, consequently a degree of vacuum of the sealed space can be raised. In the embodiment, Aluminum is used as the metal film.

FIG. 2 shows a structure in which the metal film as the gettering substance is formed on a bottom surface of the glass cover 3. The laser beam 7 is irradiated from the top surface of the glass cover 3, the metal film 1 is heated, the vaporized metal absorbs oxygen in the sealed space, consequently the degree of vacuum of the sealed space is improved. In the structure shown in FIG. 2, since the metal film 1 is not formed on the quartz resonator piece 2, vibrating characteristics of the quartz resonator piece 2 are not varied by the gettering, so that a design of the vibrator is simplified.

FIG. 1 and FIG. 2 are a type of piezoelectric vibrator in which the vibrator is hermetic-sealed in the glass container by using the anode bonding technique. On a principle of the anode bonding, oxygen is generated in bonding. The generated oxygen decreases the degree of vacuum in the container and deteriorates characteristics of the piezoelectric vibrator. Particularly, the equivalent series resistance is increased. Therefore, the laser beam is irradiated to the metal film arranged in the container, and the oxygen in the container is absorbed by heating the metal film, which allows the equivalent series resistance to be reduced.

SECOND EMBODIMENT

Figure 3:
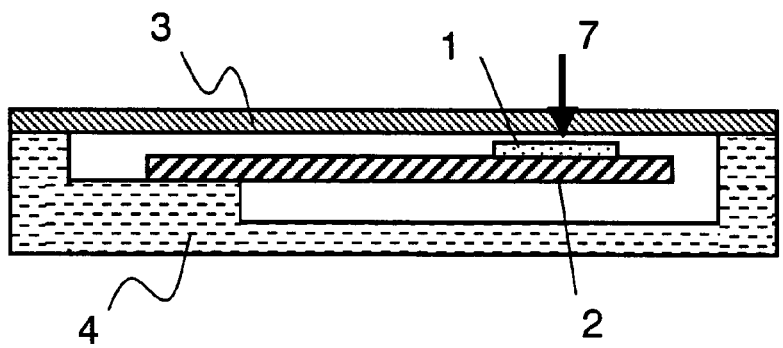
FIG. 3 is a sectional view showing a second embodiment of the invention.
Figure 4:
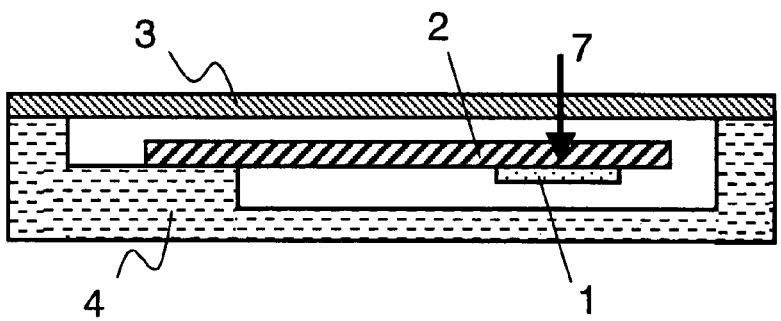
FIG. 4 is a sectional view showing a modification of the second embodiment of the invention.
Figure 5:
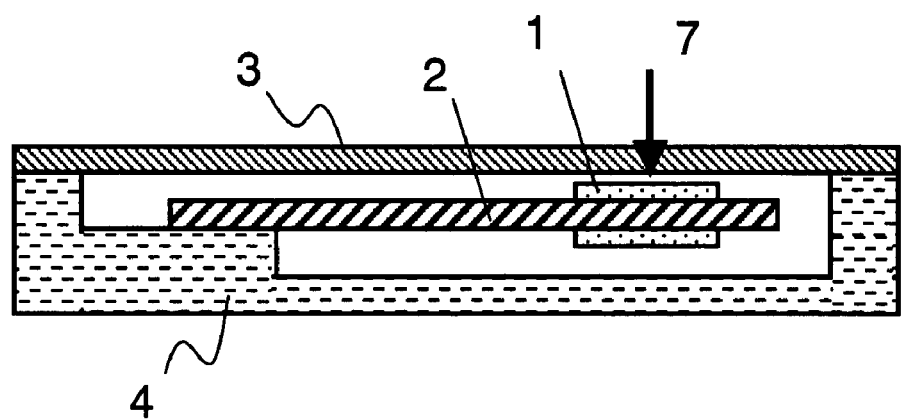
FIG. 5 is a sectional view showing another modification of the second embodiment of the invention.

A piezoelectric vibrator of a second embodiment will be described on a basis of FIGS. 3 to 5. As shown in FIGS. 3 to 5, the piezoelectric vibrator of the embodiment is a vibrator in which the quartz resonator piece is mounted in a ceramic container and sealed by the glass cover. That is to say, the piezoelectric vibrator has a structure in which a support portion is provided in a ceramic container 4, a base portion of the quartz resonator piece 2 is fixed to the support portion, and the glass cover 3 is arranged on a surface of the ceramic container 4.

In the piezoelectric vibrator shown in FIG. 3, the metal film 1 is formed on a top surface of the quartz resonator piece 2. In the piezoelectric vibrator of the embodiment shown in FIG. 4, the metal film 1 is formed on the bottom surface of the quartz resonator piece 2. FIG. 5 is the embodiment in which the metal film 1 is formed on both the top and bottom surfaces of the quartz resonator piece 2. In the same way as in the first embodiment, the same effect can be obtained that the oxygen in the container is absorbed and the equivalent series resistance is reduced as in the first embodiment, in such a manner that the laser beam is irradiated to the metal film 1 for gettering through the glass from the top surface of the glass cover.

Figure 6:
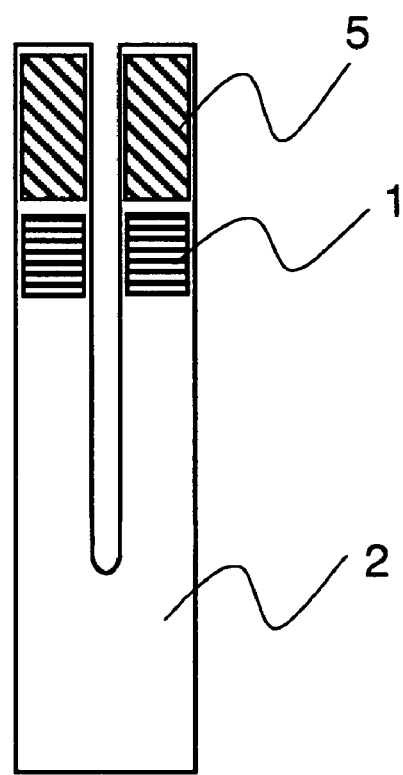
FIG. 6 is a plan view showing a tuning fork type flexure vibrator used in the embodiments of the invention.
Figure 7:
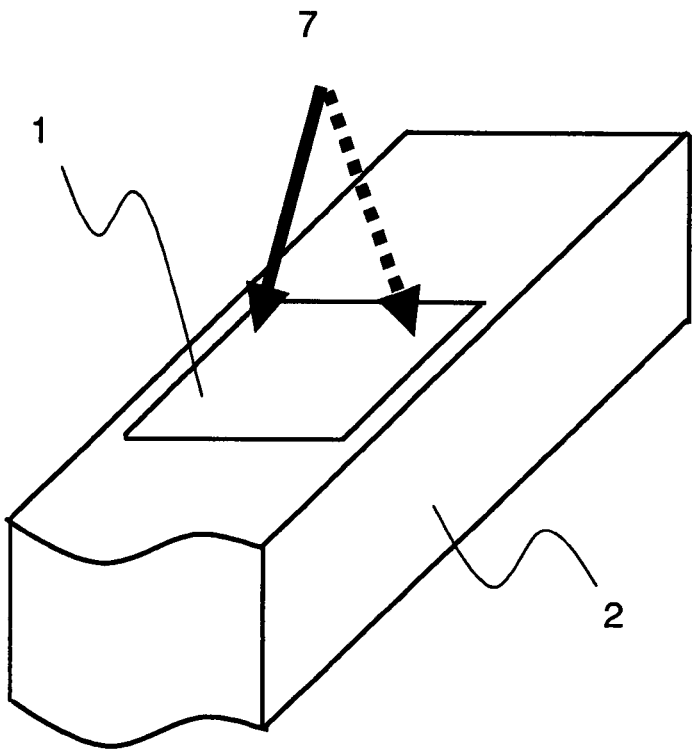
FIG. 7 is a perspective view showing laser irradiation to a metal film.
Figure 8:
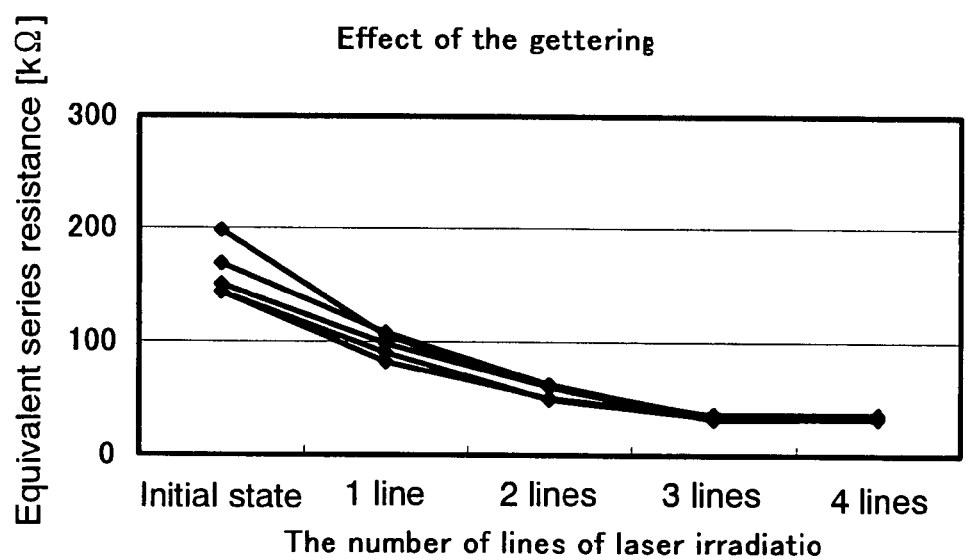
FIG. 8 is a graph showing a relationship between the number of lines of laser irradiation and an equivalent series resistance.

In each embodiment described above, a tuning fork type flexure vibrator having a shape shown in FIG. 6 is arranged. Additionally, a vibrator having a thickness shear mode is also applicable. An electrode for oscillation and a weight portion 5 for adjusting frequency are provided in an edge portion of the quartz resonator piece 2. The metal film 1 for gettering the oxygen is formed closer to a side of the base portion that in the weight portion 5 for adjusting frequency. A metal material which is easily oxidized such as aluminum, titanium, zirconium, and an alloy containing these metal elements can be used as the metal film. An Al—Si alloy or an Al—Cu alloy can be used as the metal film. Particularly the Al—Cu alloy containing 1% to 5% of Cu can be used. The metal film may be formed on any one of the top surface side, bottom surface side, and both the sides of the quartz resonator piece. In the embodiments, the metal film 1 made of aluminum is deposited by a sputtering method. After hermetic-sealing, when the laser beam is irradiated onto the metal film for gettering as shown in FIG. 7, the sputtered film made of aluminum is vaporized momentarily. At this point, the aluminum is bonded to the oxygen in the container to be aluminum oxide. The aluminum oxide is evaporated on an inside of the glass of the container. As a result, high vacuum is obtained in the container. Though a little vaporized material is evaporated also on the quartz resonator, an electric short circuit never occurs because the evaporated material on the quartz resonator is an oxide film. Because the oxide film is a fine particle, frequency shift caused by the fell-out particle neither occurs. Furthermore, a table state of the oxide film prevents gas from returning into the container. FIG. 8 is a graph showing a variation in the equivalent series resistance according to the invention. It is found from FIG. 8 that the equivalent series resistance is sufficiently reduced by several lines of the laser irradiation.

In case that the above-described method is applied to the manufacturing method for the piezoelectric vibrator having the structure described above, man-hour is hardly increased, because the metal film for gettering is irradiated by the laser beam before the weight portion is trimmed by the laser in order to finely adjust the frequency.

As described above, according to the invention, the gas which exists in the sealed container can be absorbed by heating the gettering substance provided in the sealed container, so that the vibration characteristics of the piezoelectric vibrator can be improved even though pressure in the container is increased by the anode bonding and the like to deteriorate the vibration characteristics.

What is claimed is:

1. A manufacturing method of a piezoelectric vibrator, comprising the steps of:
   providing a metal film on and in contact with a surface of a piezoelectric vibrator piece for gettering gas and providing a weight separate from the metal film on the piezoelectric vibrator piece;
   disposing the piezoelectric vibrator piece provided with the metal film and weight inside a hermetic container;
   hermetically sealing the hermetic container so that the piezoelectric vibrator piece is sealed inside the hermetic container; and
   heating the metal film by a laser beam from outside to perform gettering of gas contained in the sealed hermetic container.

2. A manufacturing method according to claim 1; wherein the piezoelectric vibrator piece is a tuning fork piezoelectric vibrator piece.

3. A manufacturing method according to claim 1; further including the step of mounting a base portion of the piezoelectric vibrator piece to the hermetic container in cantilever fashion, and wherein the metal film is located on the piezoelectric vibrator piece closer than the weight to the base portion.

4. A manufacturing method according to claim 1; wherein the weight is separate from, and does not constitute, an electrode for driving the piezoelectric vibrator piece.

5. A method of manufacturing a piezoelectric vibrator, comprising the steps of:
   providing a piezoelectric vibrator piece;
   providing a metal film for gettering gas on and in contact with a surface of the piezoelectric vibrator piece;
   providing a weight, separate from the metal film, on the piezoelectric vibrator piece;
   disposing the piezoelectric vibrator piece provided with the metal film and weight inside a hermetic container;
   hermetically sealing the hermetic container so that the piezoelectric vibrator piece is sealed inside the hermetically-sealed hermetic container; and
   heating the metal film to getter gas contained inside the hermetically-sealed hermetic container.

6. A method of manufacturing a piezoelectric vibrator according to claim 5; further including, after the heating step, the step of irradiating the weight with a laser beam to adjust the frequency of vibration of the piezoelectric vibrator piece.

7. A method of manufacturing a piezoelectric vibrator according to claim 6; wherein the heating step comprises heating the metal film by irradiating the metal film with a laser beam.

8. A method of manufacturing a piezoelectric vibrator according to claim 7; wherein the metal film is made of a material selected from the group consisting of aluminum, titanium, zirconium, an aluminum alloy, a titanium alloy and a zirconium alloy.

9. A method of manufacturing a piezoelectric vibrator according to claim 5; wherein the metal film is made of a material selected from the group consisting of aluminum, titanium, zirconium, an aluminum alloy, a titanium alloy and a zirconium alloy.

10. A method of manufacturing a piezoelectric vibrator according to claim 5; wherein the step of providing the weight comprises providing the weight separated from the metal film in a length direction of the piezoelectric vibrator.

11. A method of manufacturing a piezoelectric vibrator according to claim 5; wherein the step of providing the weight comprises providing the weight separated from the metal film in a length direction or a width direction of the piezoelectric vibrator.

12. A method of manufacturing a piezoelectric vibrator according to claim 5; wherein the piezoelectric vibrator piece is a tuning fork piezoelectric vibrator piece.

13. A method of manufacturing a piezoelectric vibrator according to claim 5; further including the step of mounting a base portion of the piezoelectric vibrator piece to the hermetic container in cantilever fashion, and wherein the metal film is located on the piezoelectric vibrator piece closer than the weight to the base portion.

14. A method of manufacturing a piezoelectric vibrator according to claim 5; wherein the weight is separate from, and does not constitute, an electrode for driving the piezoelectric vibrator piece.

* * * * *